United States Patent
Jo et al.

(10) Patent No.: US 11,714,134 B2
(45) Date of Patent: Aug. 1, 2023

(54) DEVICE AND METHOD FOR PREDICTING STATE OF BATTERY

(71) Applicant: ELECTRONICS AND TELECOMMUNICATIONS RESEARCH INSTITUTE, Daejeon (KR)

(72) Inventors: Sungwoo Jo, Daejeon (KR); Tae Moon Roh, Daejeon (KR); Sun Kyu Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 34 days.

(21) Appl. No.: 17/471,585

(22) Filed: Sep. 10, 2021

(65) Prior Publication Data

US 2022/0155381 A1    May 19, 2022

(30) Foreign Application Priority Data

Nov. 19, 2020   (KR) .................. 10-2020-0155196

(51) Int. Cl.
*G01R 31/3842* (2019.01)
*G06N 20/00* (2019.01)
*G01R 31/367* (2019.01)
*G01R 31/374* (2019.01)

(52) U.S. Cl.
CPC ....... *G01R 31/3842* (2019.01); *G01R 31/367* (2019.01); *G01R 31/374* (2019.01); *G06N 20/00* (2019.01)

(58) Field of Classification Search
None
See application file for complete search history.

(56) References Cited

U.S. PATENT DOCUMENTS

| | | | |
|---|---|---|---|
| 7,615,967 B2 | 11/2009 | Cho et al. | |
| 8,626,679 B2 | 1/2014 | Cho et al. | |
| 10,228,425 B2 | 3/2019 | Park et al. | |
| 2008/0238371 A1* | 10/2008 | Tamezane | G01R 31/3828 320/134 |
| 2015/0207357 A1 | 7/2015 | Youm et al. | |
| 2018/0278072 A1 | 9/2018 | Lee et al. | |
| 2019/0187221 A1* | 6/2019 | Mukuno | G01R 31/392 |
| 2019/0285704 A1 | 9/2019 | Lee | |
| 2021/0316636 A1* | 10/2021 | Gelso | B60L 58/12 |
| 2022/0131392 A1* | 4/2022 | Isa | H02J 7/0031 |

FOREIGN PATENT DOCUMENTS

| | | |
|---|---|---|
| KR | 10-0756837 B1 | 9/2007 |
| KR | 10-0793616 B1 | 1/2008 |
| KR | 10-2016-0000317 A | 1/2016 |
| KR | 10-1777334 B1 | 9/2017 |

* cited by examiner

*Primary Examiner* — Jas A Sanghera
(74) *Attorney, Agent, or Firm* — Rabin & Berdo, P.C.

(57) ABSTRACT

An apparatus and a method for predicting a state of a battery are provided. The apparatus includes a data measuring unit that measures information about the battery and outputs first data, a data producing unit that reflects a change in available capacity of the battery based on at least a portion of the first data to calculate a corrected state of charge and processes the first data based on the corrected state of charge to generate second data, and outputs the second data, and a battery state estimating unit that estimates state information of the battery based on the second data.

10 Claims, 17 Drawing Sheets

DEVICE AND METHOD FOR PREDICTING STATE OF BATTERY

CROSS-REFERENCE TO RELATED APPLICATIONS

This application claims priority under 35 U.S.C. § 119 to Korean Patent Application No. 10-2020-0155196 filed on Nov. 19, 2020, in the Korean Intellectual Property Office, the disclosures of which are incorporated by reference herein in their entireties.

BACKGROUND

Embodiments of the present disclosure described herein relate to a device and a method for predicting a state of a battery, and more particularly, relate to a device and a method for predicting a state of health (SOH) of the battery based on a corrected state of charge (SOC) of the battery.

Recently, with the rapid increase in devices, each of which uses a battery, for example, mobile devices or electric vehicles, interest in and research on a technology of predicting a state of the battery have increased rapidly. When an inaccurate result is derived when predicting the state of the battery, the permanent damage of a battery cell by overcharge of the battery, overdischarge of the battery, or the like may occur. Furthermore, because the problem of system disruption due to low battery is able to occur, the need for a technology capable of more accurately predicting a state of the battery is emerging.

An existing method for predicting a state of the battery estimates a state of health (SOH) of the battery by mainly using a state of charge (SOC). Such a method requires calculation of an accurate SOC. However, a calculation error of the SOC may be accumulated by noise accumulated in a measurement sensor over time, an error of an estimated value for the SOH of the battery increases due to this. Furthermore, the SOC may be inaccurately calculated by a unique characteristic a battery cell has.

Meanwhile, a method for measuring resistance in the battery and estimating the SOH of the battery is frequently used. However, according to such a method, there is an essential need for a previous estimation table including data of the state of the battery to estimate the SOH of the battery. Because the previous estimation table does not reflect all of characteristics of respective batteries, it is impossible to estimate an accurate SOH. Furthermore, measurement of internal resistance according to surrounding temperature should be essentially accompanied for each type of battery.

SUMMARY

Embodiments of the present disclosure provide a device and a method for predicting a state of health (SOH) of a battery based on a corrected state of charge (SOC).

According to an embodiment, a device for predicting a state of a battery may include a data measuring unit that measures information about the battery and output first data, a data producing unit that reflects a change in available capacity of the battery based on at least a portion of the first data to calculate a corrected state of charge and process the first data based on the corrected state of charge to generate second data, and outputs the second data, and a battery state estimating unit that estimates state information of the battery based on the second data.

As an example, the data measuring unit may include a current sensing unit that measures current information of the battery to generate current data, a voltage sensing unit that measures voltage information of the battery to generate voltage data, and a temperature sensing unit that measures temperature information of the battery to generate temperature data. The first data may include the current data, the voltage data, and the temperature data.

As an example, the data producing unit may include a data arithmetic unit that generates the corrected state of charge and battery cycle data based on current data and outputs the corrected state of charge and the battery cycle data and a data generator that processes the first data based on the corrected state of charge and the battery cycle data to generate the second data.

As an example, the data arithmetic unit may calculate the corrected state of charge using the current data and a rated capacity of the battery, when the battery is in a first state, and may calculate the corrected state of charge using the current data and the previously estimated state information, when the battery is in a second state.

As an example, the data producing unit may include a plurality of buffers, may classify the first data depending on a classification criterion based on the corrected state of charge, and may store the first data in the plurality of buffers depending on the classification criterion.

As an example, the data producing unit may output the second data to the battery state estimating unit, when the first data is stored in each of the plurality of buffers.

As an example, the battery state estimating unit may perform machine learning.

As an example, the machine learning may be based on at least one of decision tree learning, a support vector machine, a genetic algorithm, an artificial neural network, a convolutional neural network, a recurrent neural network, and reinforcement learning.

As an example, the state information may include at least one of an available capacity of the battery, a current remaining capacity of the battery, and a remaining useful life of the battery.

According to an embodiment, a method for predicting a state of a battery may include measuring current data, voltage data, and temperature data for the battery, calculating a corrected state of charge based on the current data, classifying the current data, the voltage data, and the temperature data for each interval of a value of the corrected state of charge, processing the current data, the voltage data, and the temperature data classified for each interval of the value of the corrected state of charge, storing the data processed for each interval of the value of the corrected state of charge in a buffer, and estimating the state of the battery based on the stored data.

As an example, the method may further include initializing the buffer, when the state of the battery is estimated.

As an example, the method may further include calculating the corrected state of charge using the current data and a rated capacity of the battery, when the battery is in a first state, and calculating the corrected state of charge using the current data and previously estimated state information, when the battery is in a second state.

As an example, the method may further include generating a battery cycle data based on the corrected state of charge.

As an example, the method may further include performing machine learning for the state of the battery.

As an example, the machine learning may be based on at least one of decision tree learning, a support vector machine, a genetic algorithm, an artificial neural network, a convolutional neural network, a recurrent neural network, and reinforcement learning.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described clearly and in detail to such an extent that those skilled in the art easily carry out the present disclosure.

Terms used in the specification are used to describe embodiments and are not intended to limit the present disclosure. A singular form used in the specification may include plural forms unless otherwise specified. The expressions "comprise" and/or "comprising" used herein indicate existence of stated components, steps, operations, and/or elements, but do not exclude presence or addition of one or more other components, steps, operations, and/or elements.

The terms, such as "first", "second", and the like used in the present disclosure may be used to describe various components, but only distinguish the relevant components from other components, but do not limit the components. For example, a first component may be referred to as a second component within the technical scope of the present disclosure, and the second component may be referred to as the first component.

Unless otherwise defined herein, all terms (including technical and scientific terms) used in the specification may have the same meaning that is generally understood by a person skilled in the art. Also, terms which are defined in a dictionary and commonly used should be interpreted as not in an idealized or overly formal detect unless expressly so defined. In the specification, the same reference denotations may refer to the same components throughout the specification.

Figure 1:
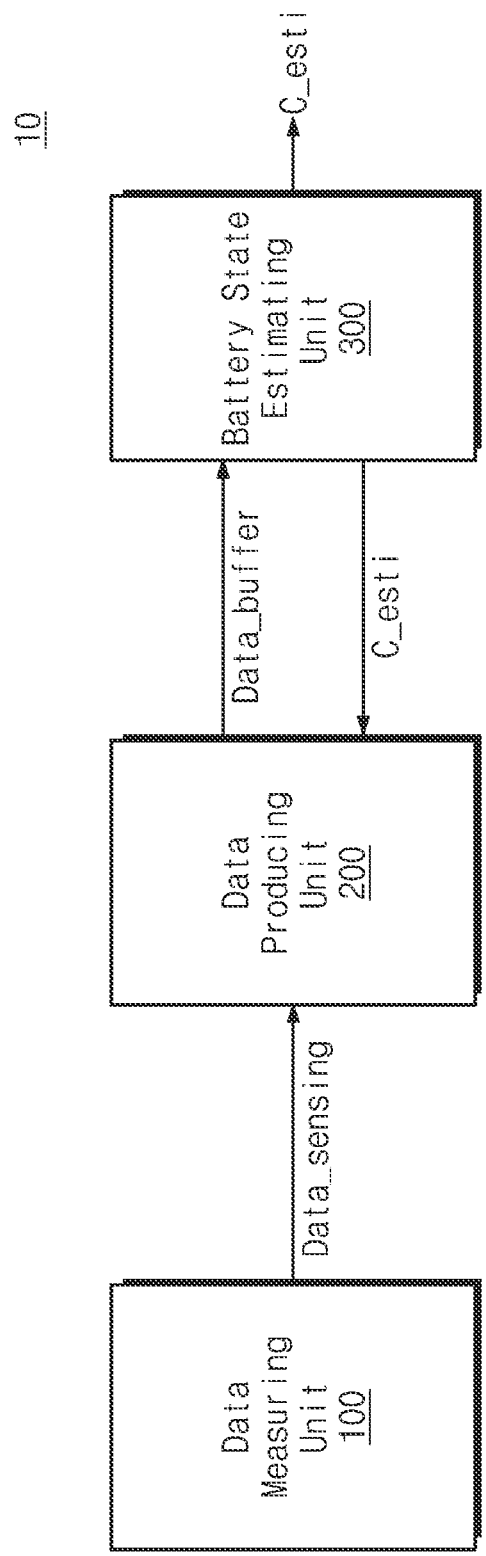
FIG. 1 is a block diagram schematically illustrating a device for predicting a state of a battery according to an embodiment of the present disclosure.

FIG. 1 is a block diagram schematically illustrating a device 10 for predicting a state of a battery according to an embodiment of the present disclosure. Referring to FIG. 1, the device 10 for predicting the state of the battery may include a data measuring unit 100, a data producing unit 200, and a battery state estimating unit 300.

The data measuring unit 100 may measure information about the battery which is a target of state prediction. As an example, the information of the battery, which is measured by the data measuring unit 100, may include current, voltage, or temperature. The data measuring unit 100 may deliver sensing data Data_sensing, collected from the battery, to the data producing unit 200. The data measuring unit 100 may include a means for measuring each of pieces of battery information. An embodiment thereof will be described in detail with reference to FIG. 2 which will be described below.

The data producing unit 200 may receive the sensing data Data_sensing from the data measuring unit 100 and may receive an estimated result C_esti from the battery state estimating unit 300. The estimated result C_esti refers to a result previously estimated from a target battery by the device 10 for predicting the state of the battery. The data producing unit 200 may generate corrected state of charge (SOC) data and battery cycle data for predicting a state of the battery, based on the sensing data Data_sensing received from the data measuring unit 100 and the estimated result C_esti received from the battery state estimating unit 300.

The data producing unit 200 may generate base data used to estimate a state of health (SOH) of the battery based on the sensing data Data_sensing, the corrected SOC, and the battery cycle data. The data producing unit 200 may store the generated base data in a buffer included in the data producing unit 200. The stored data Data_buffer in the buffer may be delivered to the battery state estimating unit 300 for estimating a state of the battery. The data producing unit 200 may include a means for measuring various data. An embodiment thereof will be described in detail with reference to FIG. 2 which will be described below.

The data state estimating unit 300 may predict a state of the battery using the stored data Data_buffer output from the buffer of the data producing unit 200. The data state estimating unit 300 may output the estimated result C_esti to the outside using the stored data Data_buffer output from the buffer of the data producing unit 200. The estimated result C_esti may include current capacity, current remaining capacity, or remaining useful life (RUL) of the battery.

The battery state estimating unit 300 may perform machine learning. The battery state estimating unit 300 may estimate the stored data Data_buffer based on the machine learning to obtain the estimated result C_esti. The machine learning performed by the battery state estimating unit 300 may be based on at least one of decision tree learning, a support vector machine, a genetic algorithm, an artificial neural network, a convolutional neural network, a recurrent neural network, and reinforcement learning. The scheme of deriving the estimated result C_esti in the battery state estimating unit 300 will be described in detail with reference FIG. 8 which will be described below.

The device 10 for predicting the state of the battery according to an embodiment of the present disclosure may measure information about the state of the battery by means of the data measuring unit 100, calculate a corrected SOC using the measured information, and may filter data based on the corrected SOC, thus extracting a feature associated with the state of the battery. The device 10 for predicting the state of the battery may estimate an SOH of the battery using the extracted feature.

An embodiment of the present disclosure may prevent an error from being accumulated over time by using the corrected SOC to predict the state of the battery. Because of using the corrected SOC for only preprocessing of data, such as classification of base data including battery information, without directly using the corrected SOC to estimate the state of the battery, it may be permitted that accuracy of the corrected SOC is lowered. Furthermore, it may be unnecessary to input data for all battery states, because of estimating the state of the battery using the machine learning, without using a previous estimation table scheme, and additional learning by means of online learning may be performed while the device 10 for predicting the state of the battery is driving to improve accuracy of estimating the state of the battery.

Figure 2:
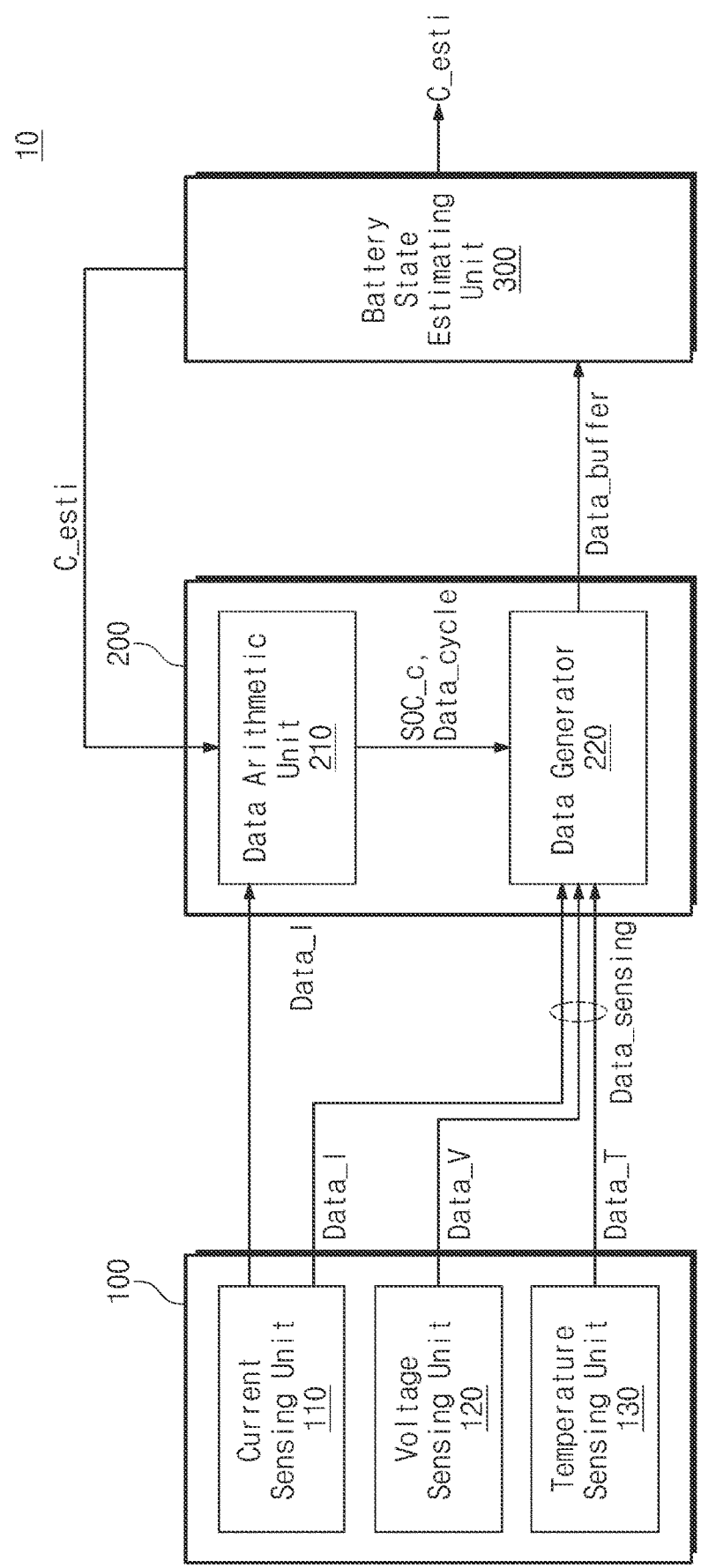
FIG. 2 is a block diagram illustrating a detailed configuration of the device for predicting the state of the battery shown in FIG. 1.

FIG. 2 is a block diagram illustrating a detailed configuration of the device 10 for predicting the state of the battery shown in FIG. 1. Referring to FIG. 2, a data measuring unit 100 included in the device 10 for predicting the state of the battery may include a current sensing unit 110, a voltage sensing unit 120, and a temperature sensing unit 130. Furthermore, a data producing unit 200 included in the device 10 for predicting the state of the battery may include a data arithmetic unit 210 and a data generator 220. Hereinafter, in the device 10 for predicting the state of the battery disclosed in FIG. 2, a detailed description of a configuration, a function, a feature, and an operation duplicated with contents described with reference to FIG. 1 will be omitted.

The current sensing unit 110 may measure an amount of output current of the battery which is a state estimation target and may output current data Data_I including information about the measured current value. For example, the current sensing unit 110 may measure an amount of accumulated output current from a time point when the battery is fully charged. The voltage sensing unit 120 may measure an output voltage of the battery which is the state estimation target and may output voltage data Data_V including information about the measured voltage value. The temperature sensing unit 130 may measure a temperature of the battery which is the state estimation target and may output temperature data Data_T including information about the measured temperature value. The current data Data_I may be delivered to the data arithmetic unit 210 included in the data producing unit 200. Sensing data Data_sensing including the current data Data_I, the voltage data Data_V, and the temperature data Data_T may be delivered to the data generator 220 included in the data producing unit 200.

The data arithmetic unit 210 may receive the current data Data_I and an estimated result C_esti generated from a battery state estimating unit 300. The data arithmetic unit 210 may generate a corrected SOC SOC_c and battery cycle data Data_cycle based on the current data Data_I and the estimated result C_esti and may deliver the corrected SOC SOC_c and the battery cycle data Data_cycle to the data generator 220. The scheme of generating the corrected SOC SOC_c and the battery cycle data Data_cycel will be described in detail with reference to FIGS. 3 to 5 which will be described below.

The data generator 220 may generate base data for estimating a state of the battery, based on the sensing data Data_sensing, the corrected SOC SOC_c, and the battery cycle data Data_cycle. The generated base data may be stored in a buffer included in the data generator 220. The data generator 220 may deliver the stored data Data_buffer, output from the buffer, to the battery state estimating unit 300. The scheme of generating the base data and storing the base data in the buffer will be described in detail with reference to FIGS. 6 and 7 which will be described below.

Figure 3:
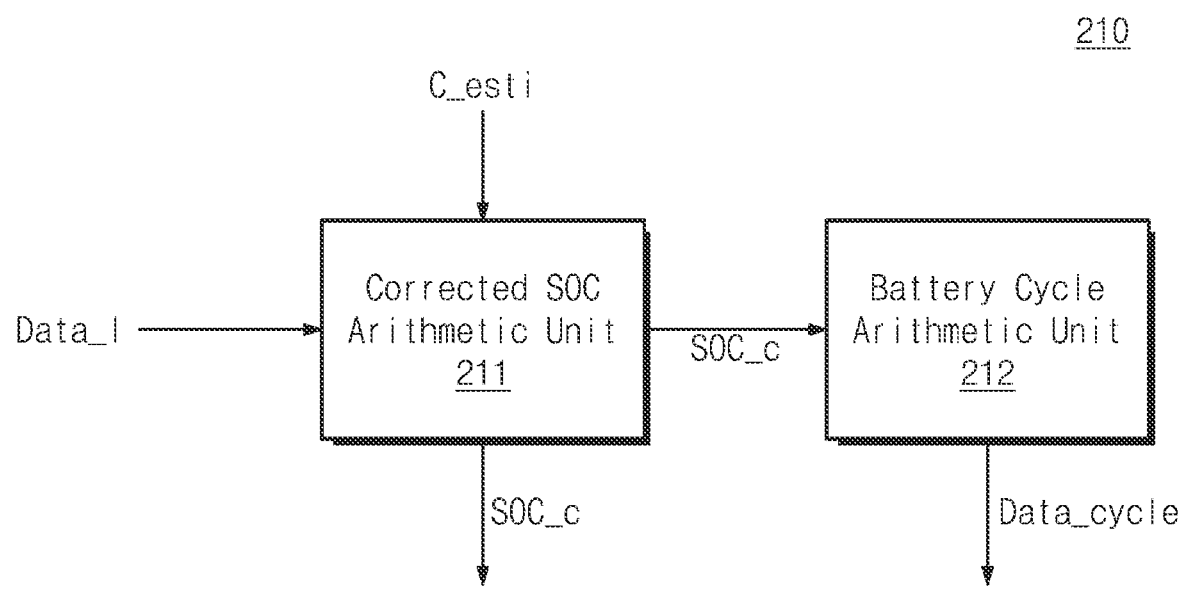
FIG. 3 is a block diagram illustrating the data arithmetic unit shown in FIG. 2.

FIG. 3 is a drawing illustrating the data arithmetic unit shown in FIG. 2. Referring to FIG. 3, the data arithmetic unit 210 may include a corrected SOC arithmetic unit 211 and a battery cycle arithmetic unit 212. Hereinafter, in the data arithmetic unit 210 disclosed in FIG. 3, a detailed description of a configuration, a function, a feature, and an operation duplicated with contents described with reference to FIGS. 1 and 2 will be omitted.

The corrected SOC arithmetic unit 211 may receive current data Data_I from a data measuring unit 100 (refer to FIG. 1) and may receive an estimated result C_esti from a battery state estimating unit 300 (refer to FIG. 1). The corrected SOC arithmetic unit 211 may derive a correct SOC SOC_c based on the current data Data_I, the estimated result C_estim, and rated capacity of a battery. The corrected SOC arithmetic unit 211 may deliver the corrected SOC SOC_c to a data generator 220 (refer to FIG. 2) and the battery cycle arithmetic unit 212. The concept of the corrected SOC SOC_c will be described in detail with reference to FIG. 4 which will be described below. A method for calculating the corrected SOC SOC_c will be described in detail with reference to FIG. 5 which will be described below.

The battery cycle arithmetic unit 212 may receive the corrected SOC SOC_c from the corrected SOC arithmetic unit 211 and may derive battery cycle data Data_cycle including information about a battery cycle based on the corrected SOC SOC_c. The battery cycle may increase by 1, when the battery which is a state estimation target is discharged fully or below a predetermined ratio in a state where the battery is charged fully or above the predetermined ratio and is charged again fully or above the predetermined ratio. For example, when a process where the battery is fully discharged in the state it is fully charged is repeated two times and the battery is then fully charged again, the battery cycle may be 2. The battery cycle arithmetic unit 212 may deliver such battery cycle data Data_cycle to the data generator 220, thus reflecting a characteristic where the more the battery cycle increases, the worse the battery aging becomes.

Figure 4:
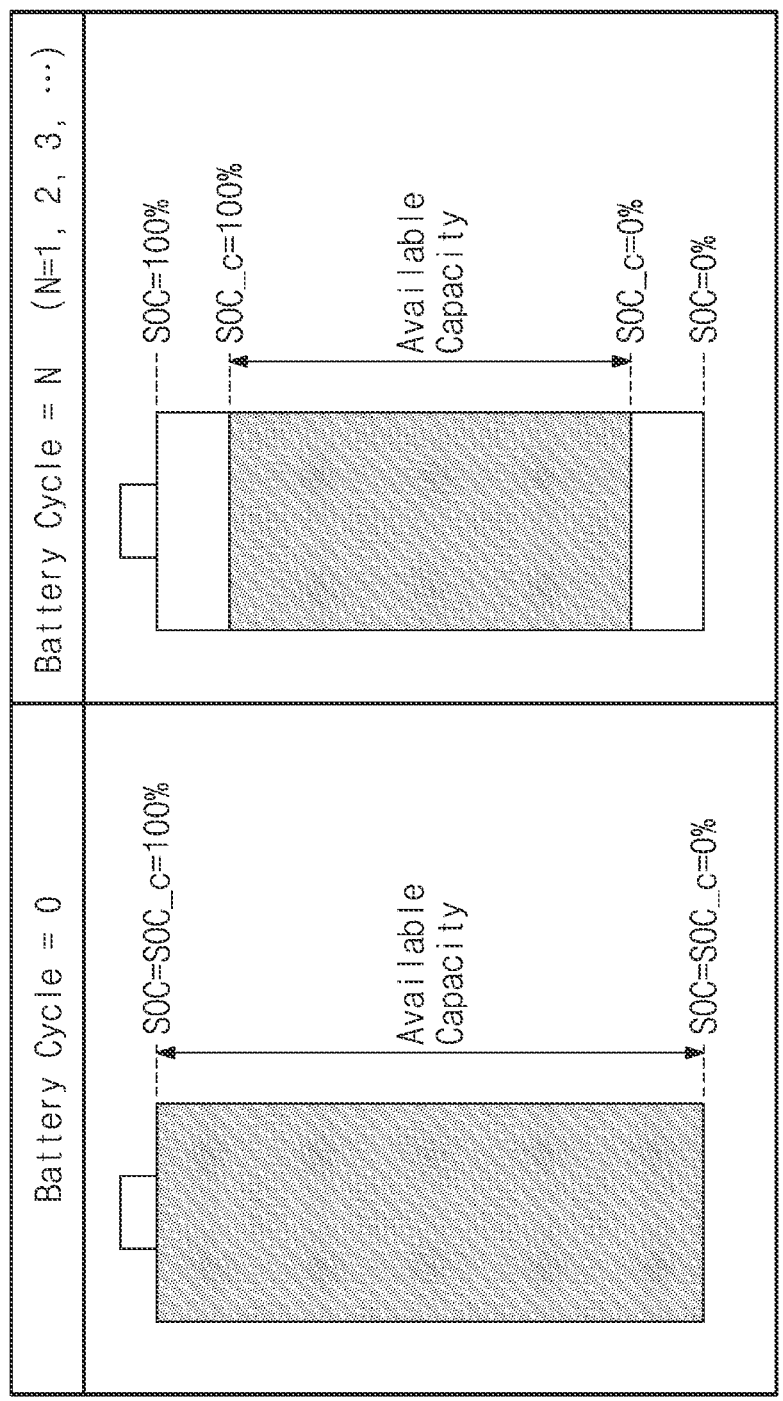
FIG. 4 is a drawing illustrating the concept of a corrected state of charge (SOC) used in a device for predicting a state of a battery according to an embodiment of the present disclosure.

FIG. 4 is a drawing illustrating the concept of a corrected SOC SOC_c used in a device 10 for predicting a state of a battery (refer to FIG. 1) according to an embodiment of the present disclosure. In general, the SOC may be defined as 100%, when a charge is fully charged by a rated capacity of the battery, and may be defined as 0%, when the charge in the battery is fully discharged. In other words, the SOC may be determined as a value of 0% to 100% depending to an amount of charge in the battery on the basis of the rated capacity of the battery. Meanwhile, a value of a corrected SOC SOC_c may be determined on the basis of an available capacity of the battery.

Referring to FIG. 4, when the battery cycle is 0, the capacity of the battery and the available capacity of the battery are the same as each other when the SOC is 100%. Thus, when the battery cycle is 0, the corrected SOC SOC_c may be calculated in the same manner as the SOC. However, when the battery cycle is not 0, in other words, when the battery cycle is N (N=1, 2, 3, . . . ), the available capacity of the battery decreases depending on battery aging. In this case, the corrected SOC SOC_c may be defined as 100%, when a charge is fully charged in a range of the available capacity of the battery, and may be defined as 0%, when the charge is fully discharged in the range of the available capacity of the battery.

Figure 5:
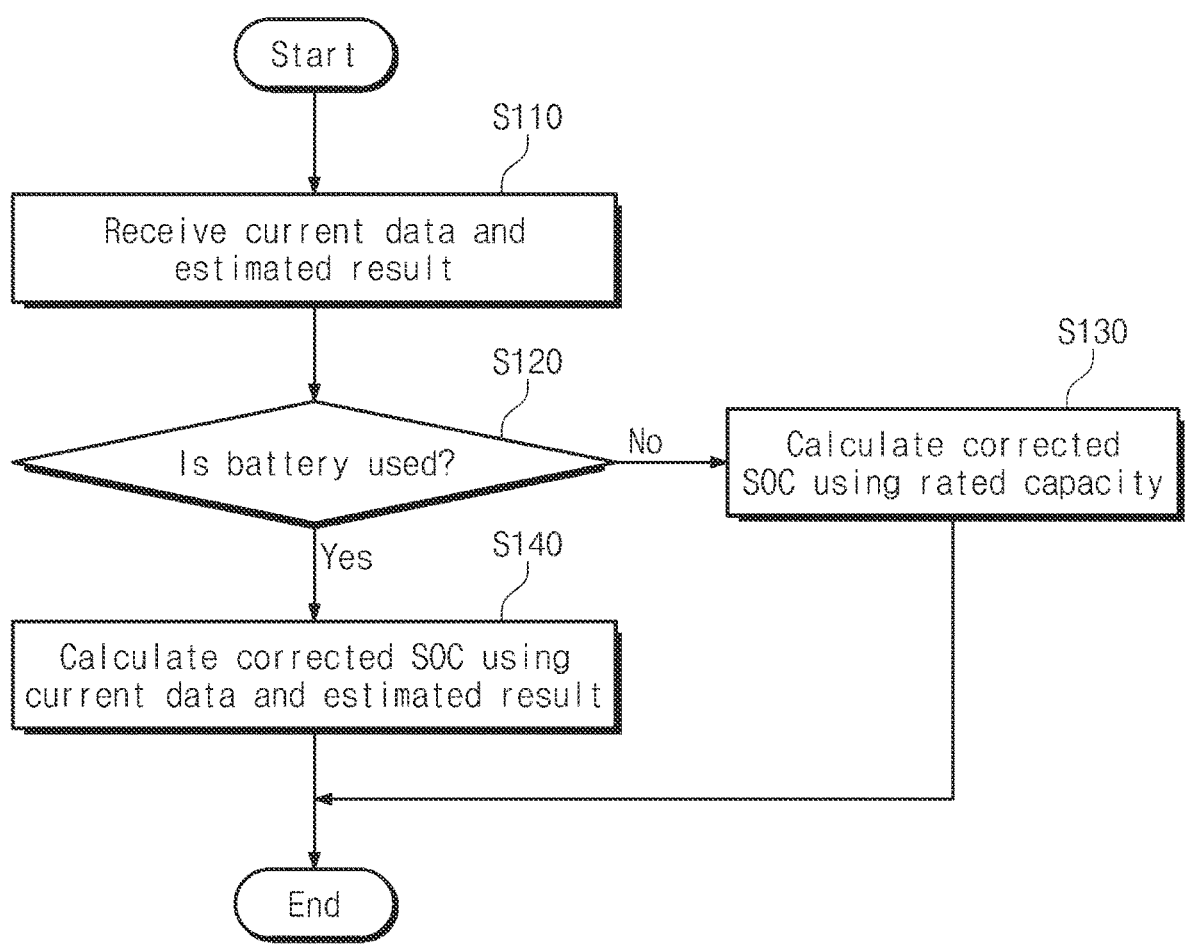
FIG. 5 is a flowchart illustrating a method for calculating a corrected SOC used in a device for predicting a state of a battery according to an embodiment of the present disclosure.

FIG. 5 is a flowchart illustrating a method for calculating a corrected SOC SOC_c (refer to FIG. 3) used in a device 10 for predicting a state of a battery (refer to FIG. 1) according to an embodiment of the present disclosure.

In operation S110, a corrected SOC arithmetic unit 211 (refer to FIG. 3) may receive current data Data_I (refer to FIG. 2) from a data measuring unit 100 (refer to FIG. 1) and may receive an estimated result C_esti (refer to FIG. 1) from a battery state estimating unit 300 (refer to FIG. 1). When performing initial state estimation for a battery which is an estimation target, the corrected SOC arithmetic unit 211 may fail to receive the estimated result C_esti.

In operation S120, the corrected SOC arithmetic unit 211 may determine whether the battery is used, based on the received estimated result C_esti. When it is determined that the battery is in a first state, the procedure may proceed to operation S130. The first state of the battery refers to a state where the battery is not used, in other words, refers to when there is no previously estimated state information of the battery as when the battery is initially used. Meanwhile, when it is determined that the battery is in a second state, the procedure may proceed to operation S140. The second state of the battery refers to a state where the battery is used, in other words, refers to when there is previously estimated state information of the battery as when the battery is continuously used.

In operation S130, the corrected SOC arithmetic unit 211 may calculate the corrected SOC SOC_c based on the current data Data_I for the battery which is in the first state and a rated capacity of the battery which is an estimation target. In this case, the corrected SOC SOC_c may be calculated as Equation 1 below. In Equation 1 below, I denotes the amount of current supplied to the battery, when the battery is being charged, and $C_{rated}$ denotes the rated capacity. Furthermore, t1 denotes the time point when the battery is fully charged, and t2 denotes the current time. The derived corrected SOC SOC_c may be delivered to a data generator 220 (refer to FIG. 2), and the procedure may be ended. When the battery is being discharged, I denotes the amount of current the battery flows out. The corrected SOC SOC_c may be defined as the result of subtracting Equation 1 below from 100%.

$$\text{Corrected } SOC(SOC_C) = \int_{t1}^{t2} \frac{I}{C_{rated}} dt \times 100(\%) \quad \text{[Equation 1]}$$

In operation S140, the corrected SOC arithmetic unit 211 may calculate the corrected SOC SOC_c based on the current data Data_I for the battery which is in the second state and the estimated result C_esti. In this case, the corrected SOC SOC_c may be calculated as Equation 2 below. In Equation 2 below, I denotes the amount of current supplied to the battery, when the battery is being charged, and $C_{esti}$ denotes the estimated result C_esti. Furthermore, t1 denotes the time point when the battery is fully charged, and t2 denotes the current time. The derived corrected SOC SOC_c may be delivered to the data generator 220, and the procedure may be ended. When the battery is being discharged, I denotes the amount of current the battery flows out. The corrected SOC SOC_c may be defined as the result of subtracting Equation 2 below from 100%.

$$\text{Corrected } SOC(SOC_C) = \int_{t1}^{t2} \frac{I}{C_{est}} dt \times 100(\%) \quad \text{[Equation 2]}$$

Figure 6:
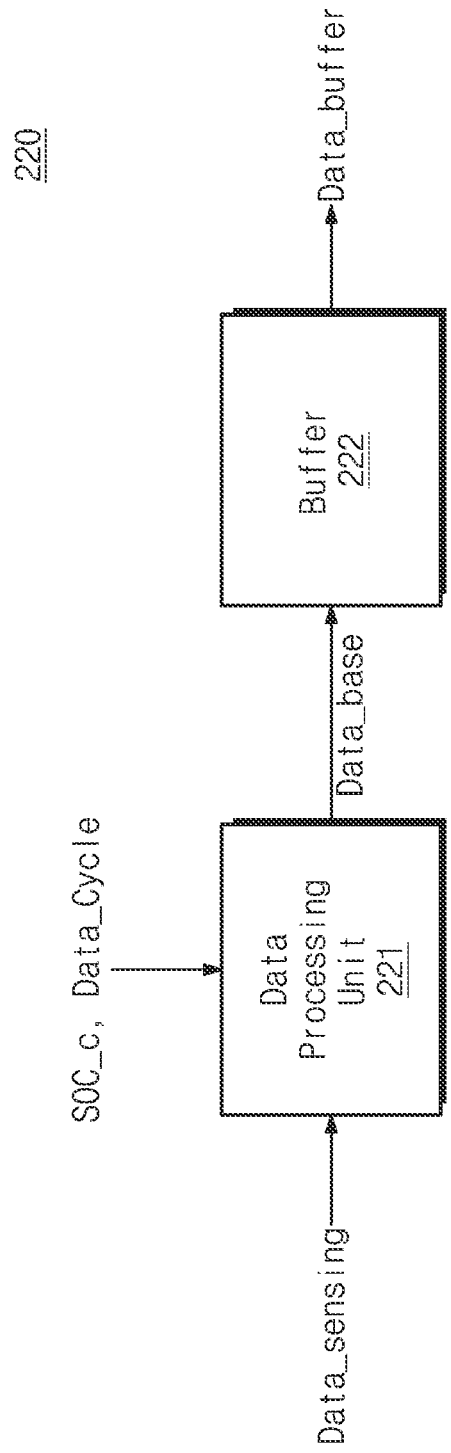
FIG. 6 is a drawing illustrating the data generator shown in FIG. 2.

FIG. 6 is a drawing illustrating the data generator 220 shown in FIG. 2. Referring to FIG. 6, the data generator 220 may include a data processing unit 221 and at least one buffer 222.

The data processing unit 221 may receive sensing data Data_sensing from a data measuring unit 100 (refer to FIG. 1) and may receive a corrected SOC SOC_c and a battery cycle data Data_cycel from a data arithmetic unit 210 (refer to FIG. 2). The data processing unit 221 may process data based on the sensing data Data_sensing and the corrected SOC SOC_c to generate base data Data_base for estimating an SOH of a battery. The data processing unit 221 may deliver the base data Data_base and the battery cycle data Data_cycle received from the data arithmetic unit 210 to the at least one buffer 222.

The at least one buffer 222 may store the base data Data_base generated by the data processing unit 221 and the battery cycle data Data_cycle. In FIG. 6, only the one buffer 222 is shown, but the number of buffers 222 included in the data generator 220 is not limited thereto. In other words, a device 10 for predicting a state of a battery (refer to FIG. 1) may include N (N is a natural number greater than or equal to 1) buffers 222. The stored data Data_buffer in the at least one buffer 222 may be delivered to the battery state estimating unit 300 (refer to FIG. 1) for estimating the SOH of the battery.

In an embodiment according to the present disclosure, the data processing unit 221 may perform data processing based on the corrected SOC SOC_c, without performing data processing on the basis of time series. For example, in an embodiment according to the present disclosure, when the buffer 222 includes N buffers, the data processing unit 221 may classify the received data depending on Equation 3 below.

$$\begin{cases} k\frac{100}{N}\% \leq SOC_c < (k+1)\frac{100}{N}\% \ (k = 0, 1, \cdots, N-2) \\ k\frac{100}{N}\% \leq SOC_c \leq (k+1)\frac{100}{N}\% \ (k = N-1) \end{cases} \quad \text{[Equation 3]}$$

Equation 3 shows a scheme for dividing an interval between 0% to 100% in the corrected SOC SOC_c into N and respectively storing pieces of information associated with the N intervals in N buffers. When the corrected SOC SOC_c is 0%, related information may be classified according to a condition where k=0. The data processing unit 221 may process data depending on the classified result to generate base data Data_base. As an example, the data processing unit 221 may generate the base data Data_base by means of a data processing scheme based on at least one of an average value, a minimum value, a maximum value, or a central value of each of current, voltage, and temperature of sensing data Data_sensing including in a corresponding interval, and discarding of the other values except for a specific corrected SOC SOC_c, based on the classified result. The data processing unit 221 may deliver the generated base data Data_base to the buffer 222, and the buffer 222 may store the base data Data_base like Table 1 below.

TABLE 1

|  | Buffer 0 | Buffer 1 | Buffer 2 | ... | Buffer N-2 | Buffer N-1 |
|---|---|---|---|---|---|---|
| Current | $I_0$ | $I_1$ | $I_2$ | ... | $I_{N-2}$ | $I_{N-1}$ |
| Voltage | $V_0$ | $V_1$ | $V_2$ | ... | $V_{N-2}$ | $V_{N-1}$ |
| Temperature | $T_0$ | $T_1$ | $T_2$ | ... | $T_{N-2}$ | $T_{N-1}$ |

In Table 1 above, buffer 0 may store base data $I_0$, $V_0$, and $T_0$, which are present in a range of 0

$$\% \leq SOC_c \leq \frac{100}{N}\%.$$

Buffer N-2 may store base data $I_{N-2}$, $V_{N-2}$, and $T_{N-2}$, which are present in a range of $$(N-2)\frac{100}{N}\% \leq SOC_c < (N-1)\frac{100}{N}\%.$$

Buffer N-1 may store base data $I_{N-1}$, $V_{N-1}$, and $T_{N-1}$, which are present in a range of $$(N-1)\frac{100}{N}\% \leq SOC_c \leq 100\%.$$

In Table 1 above, only the base data associated with current, voltage, and temperature are disclosed, but the corrected SOC SOC_c and the battery cycle data Data_cycle may also be stored in the buffer 222 additionally.

In a state where base data Data_base is not stored in all of N buffers (Buffer 0, Buffer 1, . . . , Buffer N-2 of Table 1 above), the data generator 220 may repeat a series of processes of receiving sensing data Data_sensing and a corrected SOC SOC_c and storing base data Data_base generated by processing the received data in the buffer 222. In other words, only when the base data Data_base should be stored in all the N buffers (Buffer 0, Buffer 1, . . . , Buffer N-2 of Table 1 above), the data generator 220 may deliver the stored data Data_buffer to a battery state estimating unit 300 (refer to 1).

Figure 7:
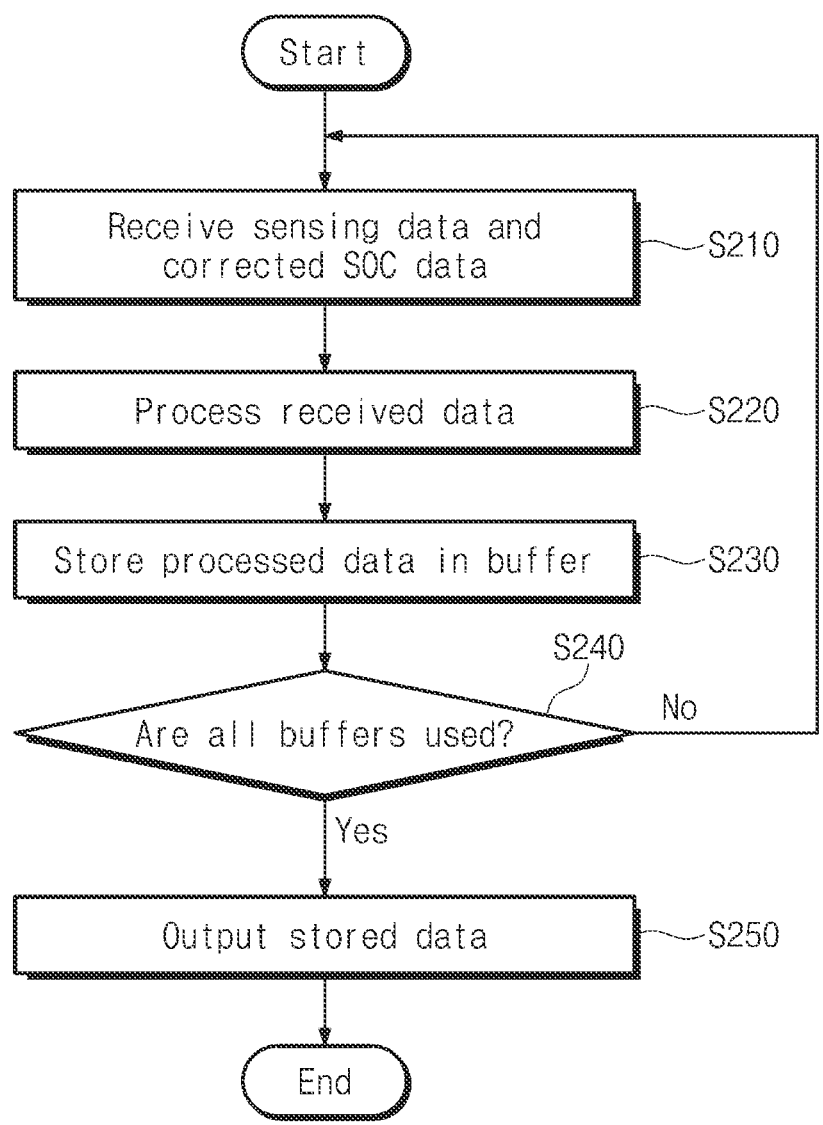
FIG. 7 is a flowchart illustrating a data processing and storing method in the data generator shown in FIG. 6.

FIG. 7 is a flowchart illustrating a data processing and storing method in the data generator 220 (refer to FIG. 2) shown in FIG. 6. Hereinafter, in the method for processing and storing data disclosed in FIG. 7, a detailed description of a function, a feature, and an operation duplicated with contents described with reference to FIG. 6 will be omitted.

In operation S210, the data generator 220 may receive sensing data Data_sensing (refer to FIG. 6) from a data measuring unit 100 (refer to FIG. 1) and may receive a corrected SOC SOC_c (refer to FIG. 6) from a data arithmetic unit 210 (refer to FIG. 2).

In operation S220, the data generator 220 may process the data received from the data arithmetic unit 210. In detail, the data generator 220 may classify the sensing data Data_sensing, using the corrected SOC SOC_c, and may process the sensing data Data_sensing depending to a classification criterion to generate base data Data_base (refer to FIG. 6).

In operation S230, the data generator 220 may store the base data Data_base in at least one buffer 222 (refer to FIG. 6). The data generator 220 may include the N buffers 222. The data generator 220 may store the base data Data_base in the corresponding buffer 222 depending on a criterion classified in operation S220.

In operation S240, the data generator 220 may determine whether base data Data_base is stored all the N buffers 222. When the base data Data_base is not stored in all the buffers 222, the procedure may return to operation S210. When the base data Data_base is stored in all the buffers 222, the procedure may proceed to operation S250.

In operation S250, the data generator 220 may output the stored data Data_buffer (refer to FIG. 6) stored in the buffer 222 to a battery state estimating unit 300 (refer to FIG. 1) and may end the procedure.

Figure 8:
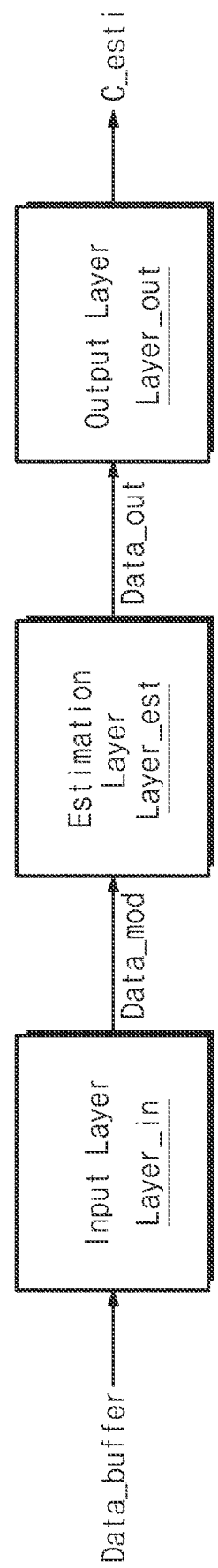
FIG. 8 is a block diagram illustrating an operation of the battery state estimating unit shown in FIG. 1.

FIG. 8 is a block diagram illustrating an operation of the battery state estimating unit 300 (refer to FIG. 1) shown in FIG. 1. The battery state estimating unit 300 which performs machine learning may include an input layer Layer_in, an estimation layer Layer_est, and an output layer Layer_out.

The input layer Layer_in may receive the stored data Data_buffer output from a data generator 220 (refer to FIG. 2). The input layer Layer_in may modify a data format of the received the stored data Data_buffer to suit the estimation layer Layer_est. The input layer Layer_in may deliver the data Data_mod, the format of which is modified, to the estimation layer Layer_est.

The estimation layer Layer_est may deliver output data Data_out derived by estimating the data Data_mod, the format of which is modified, based on machine learning to the output layer Layer_out. The estimation layer Layer_est may perform estimation based on machine learning based on at least one of decision tree learning, a support vector machine, a genetic algorithm, an artificial neural network, a convolutional neural network, a recurrent neural network, and reinforcement learning.

The output layer Layer_out may derive an estimated result C_esti of a state of a battery based on the output data Data_out. The output layer Layer_out may modify a format of the output data Data_out to suit a format of the estimated result C_esti to be derived. The output layer Layer_out may deliver the derived estimated result C_esti to the outside.

Figure 9:
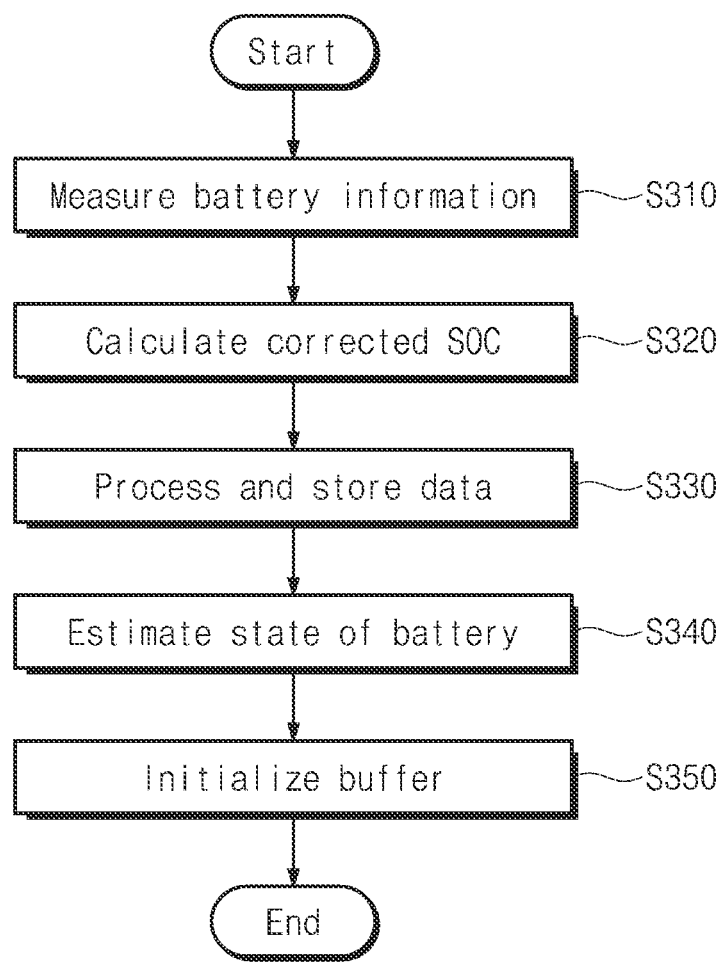
FIG. 9 is a flowchart illustrating a method for estimating a state of a battery according to an embodiment of the present disclosure.

FIG. 9 is a flowchart illustrating a method for estimating a state of a battery according to an embodiment of the present disclosure. Hereinafter, in the method for estimating the state of the battery disclosed in FIG. 9, a detailed description of a configuration, a function, a feature, and an operation duplicated with contents described with reference to FIGS. 1 and 8 will be omitted.

In operation S310, a data measuring unit 100 (refer to FIG. 1) of a device 10 for estimating a state of a battery (refer to FIG. 1) may measure information of the battery. The measured information of the battery may include an amount of output current of the battery, an amount of output voltage of the battery, and a temperature of the battery. The data measuring unit 100 may deliver the measured information of the battery to a data producing unit 200 (refer to FIG. 1) in the form of current data Data_I (refer to FIG. 2), voltage data Data_V (refer to FIG. 2), temperature data Data_T (refer to FIG. 2), or sensing data Data_sensing (refer to FIG. 1).

In operation S320, the data producing unit 200 of the device 10 for estimating the state of the battery may calculate a corrected SOC SOC_c (refer to FIG. 2) based on the current data Data_I. The corrected SOC SOC_c may be differently calculated according to whether the battery is used. The corrected SOC SOC_c may be calculated using the current data Data_I and rated capacity, when the battery is not used, and may be calculated using the current data Data_I and a previous estimated result C_esti, when the battery is used.

In operation S330, the data producing unit 200 may classify data using the corrected SOC SOC_c calculated in operation S320 and may process the data depending to the classification criterion to generate base data Data_base (refer to FIG. 6). The generated base data Data_base may be stored in a buffer 222 (refer to FIG. 6) included in the data producing unit 200. When base data Data_base is stored in all the buffers 222 included in the data producing unit 200, the data producing unit 200 may deliver the stored data Data_buffer (refer to FIG. 1) to a battery state estimating unit 300 (refer to FIG. 1).

In operation S340, the battery state estimating unit 300 may perform battery state estimating based on machine learning with respect to the received the stored data Data_buffer. The battery state estimating unit 300 may output the estimated result C_esti to the outside of the device 10 for estimating the state of the battery.

In operation S350, when the estimated result C_esti is derived by the battery state estimating unit 300, the data producing unit 200 may initialize the buffer 222. When the buffer 222 is initialized, the above-mentioned series of processes may be sequentially repeated to perform continuous monitoring of the state of the battery.

Figure 10A:
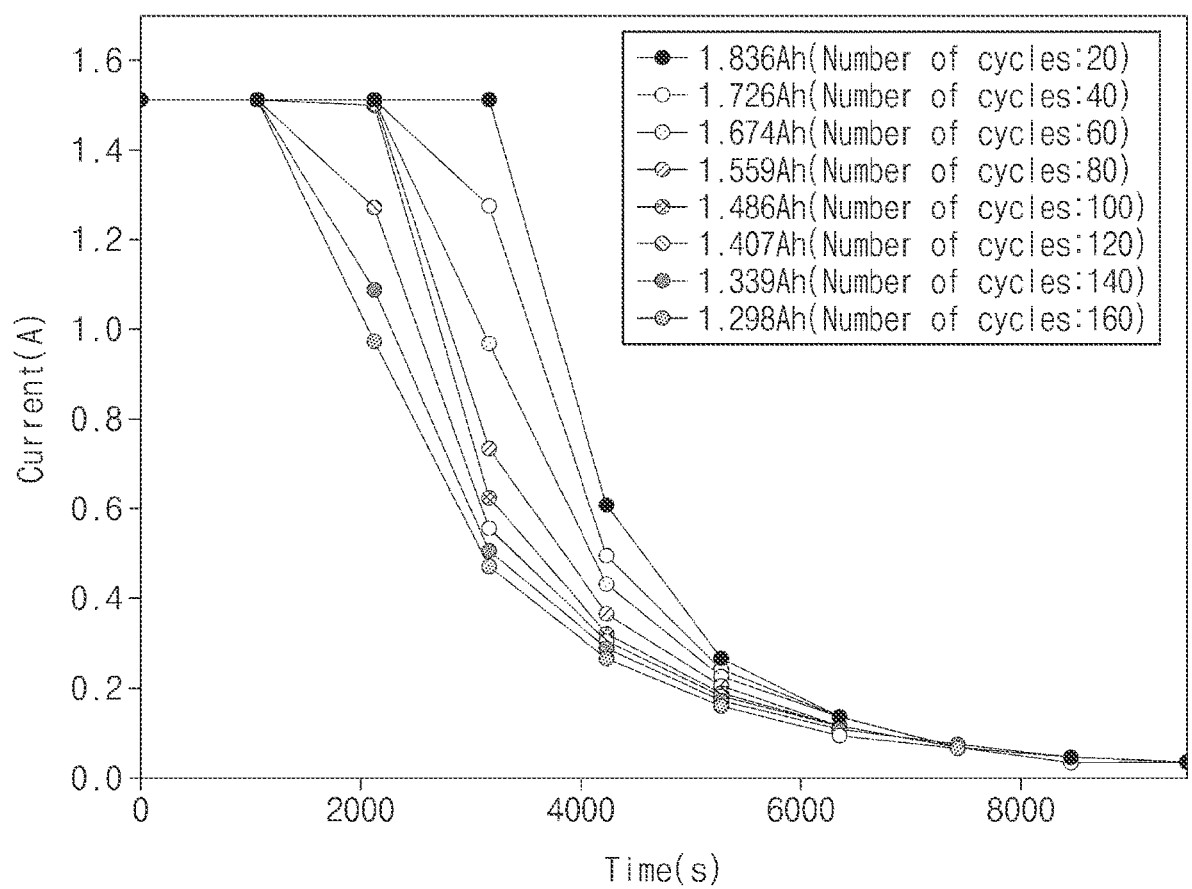
FIGS. 10A, 10B, and 10C are drawings illustrating an aspect of sensing data extracted on the basis of time series.
Figure 10B:
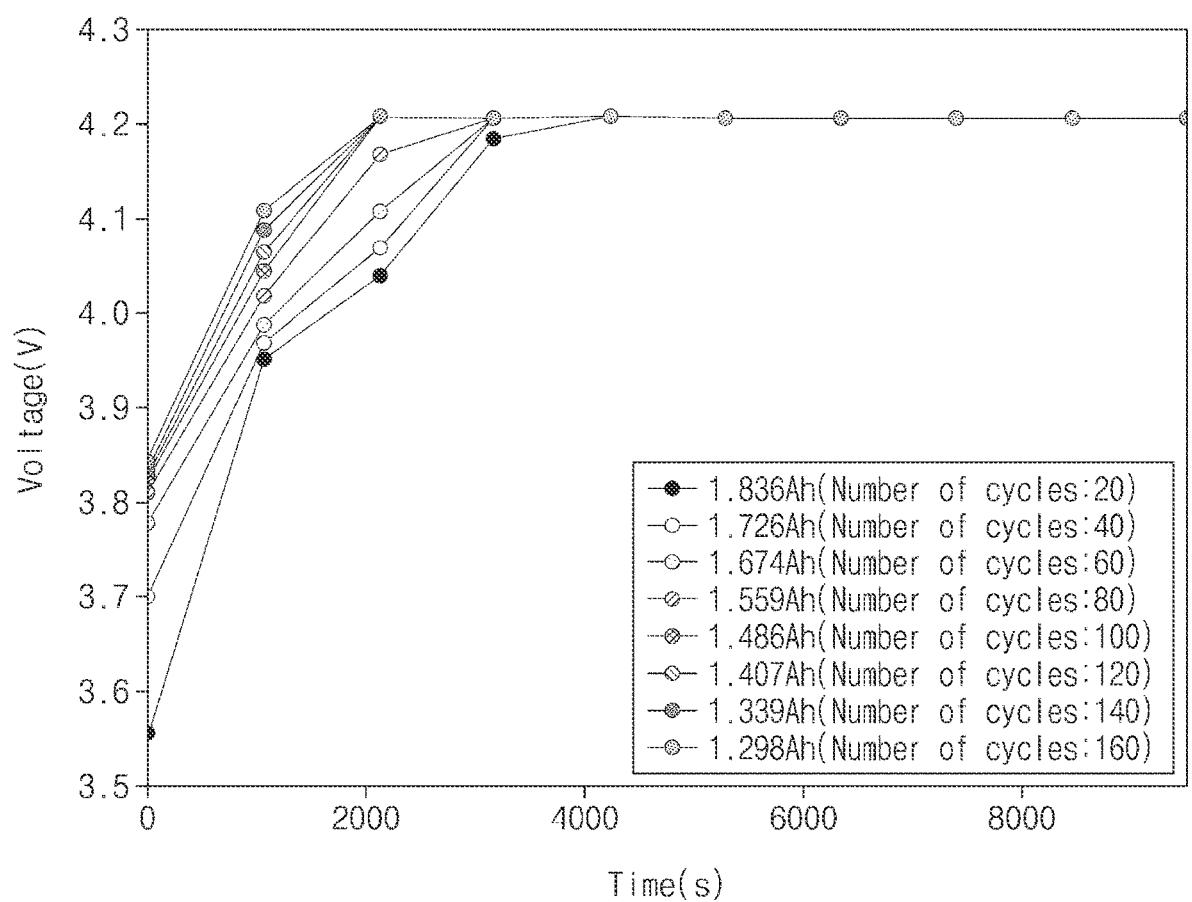
Figure 10C:
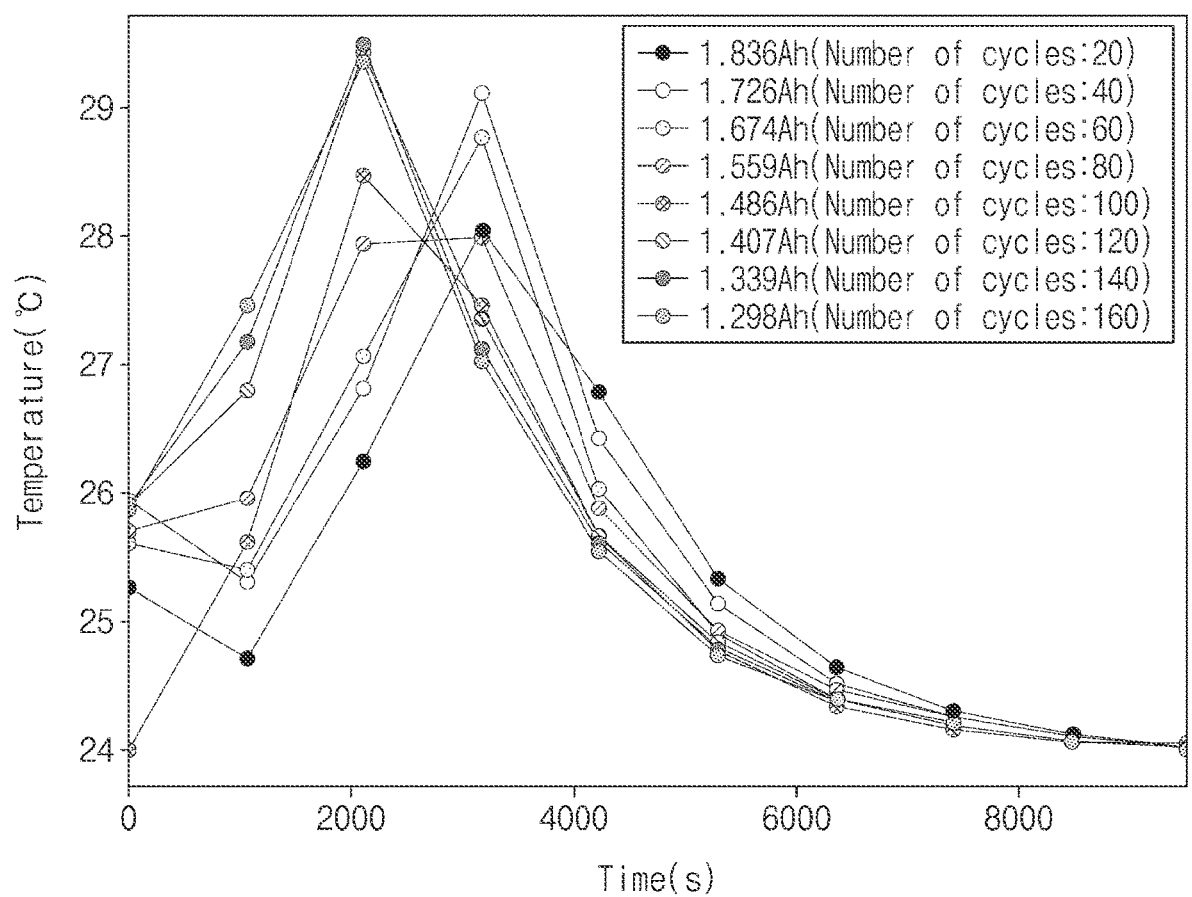

FIGS. 10A to 10C are drawings illustrating an aspect of sensing data extracted based on time flow. In detail, FIG. 10A illustrates an aspect of current data extracted based on time flow. FIG. 10B illustrates an aspect of voltage data extracted based on time flow. FIG. 10C illustrates an aspect of temperature data extracted based on time flow.

Figure 11A:
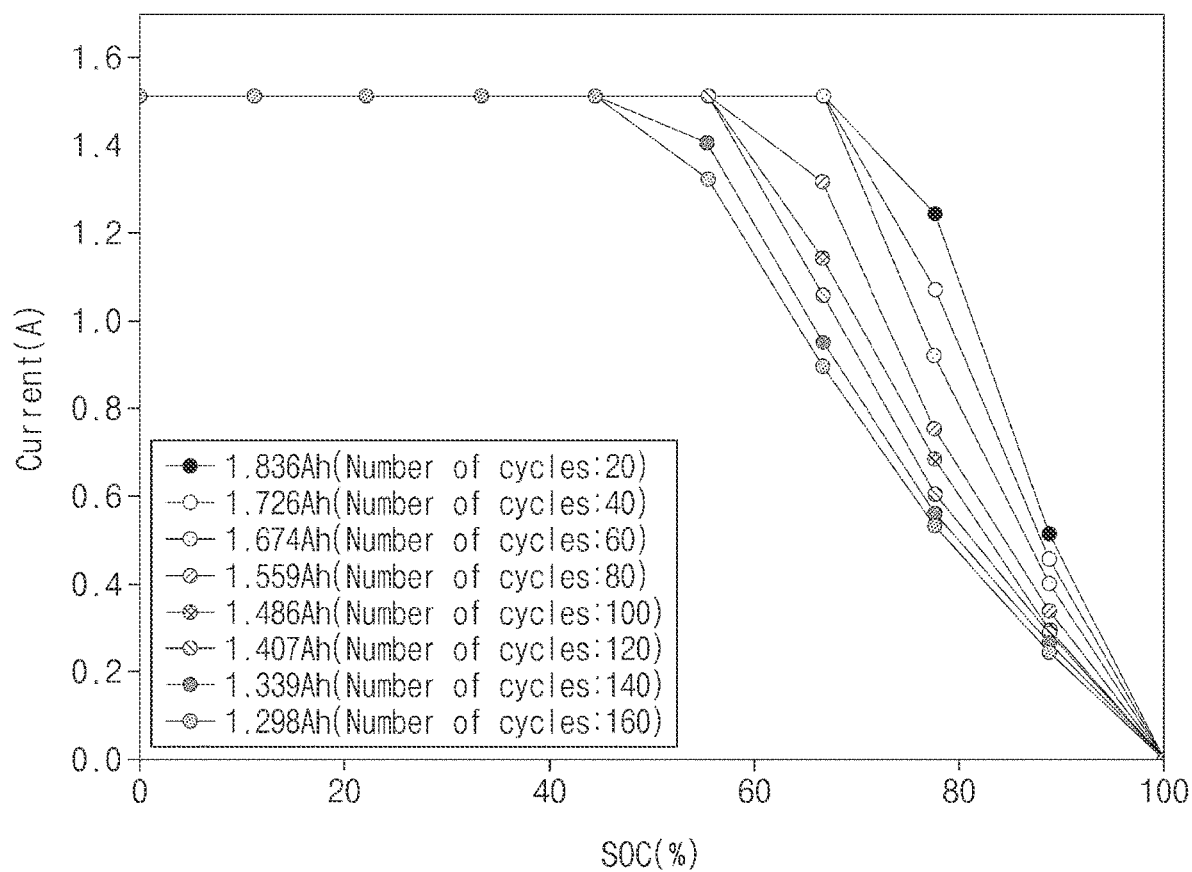
FIGS. 11A, 11B, and 11C are drawings illustrating an aspect of sensing data extracted on the basis of a corrected SOC.
Figure 11B:
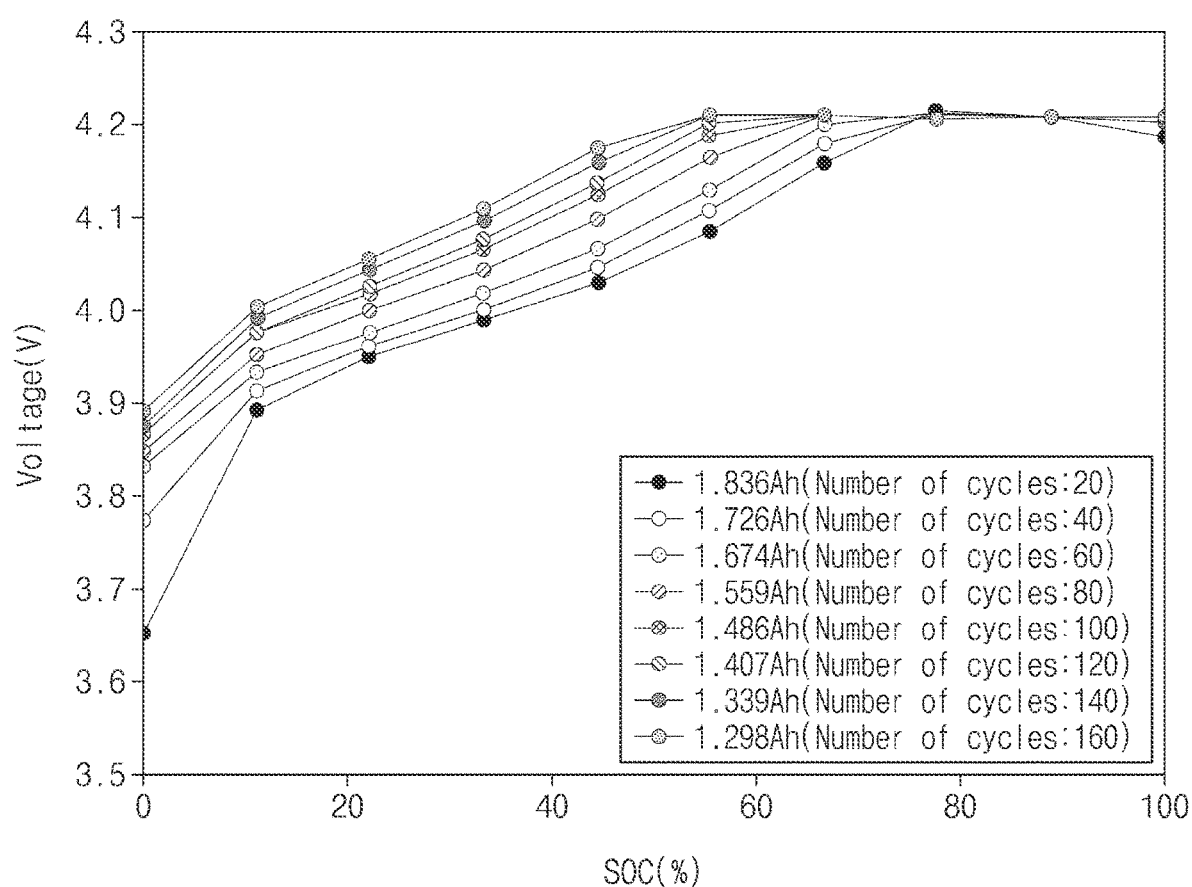
Figure 11C:
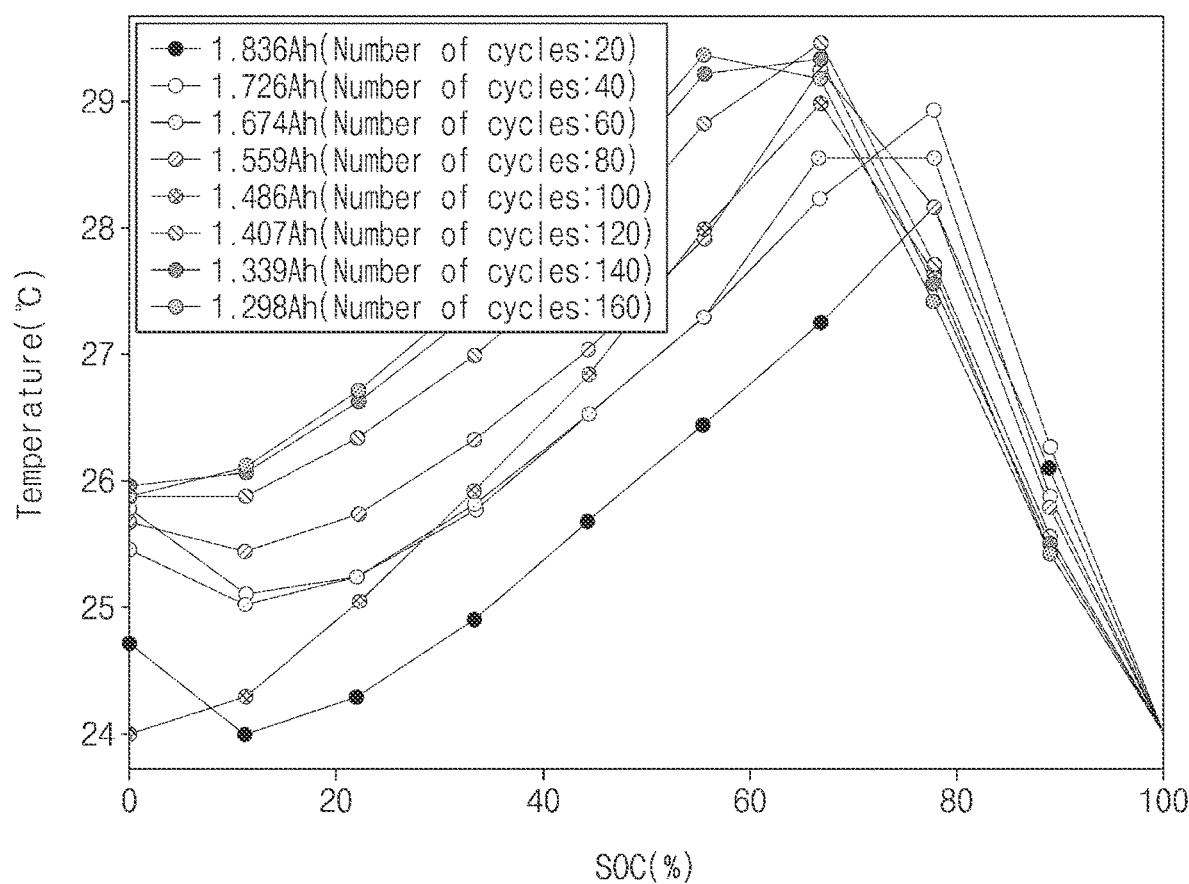

FIGS. 11A to 11C are drawings illustrating an aspect of sensing data extracted on the basis of a corrected SOC SOC_c (refer to FIG. 2). In detail, FIG. 11A illustrates an aspect of current data extracted on the basis of the corrected SOC SOC_c. FIG. 11B illustrates an aspect of voltage data extracted on the basis of the corrected SOC SOC_c. FIG. 11C illustrates an aspect of temperature data extracted on the basis of the corrected SOC SOC_c.

Comparing FIG. 10A with FIG. 11A, it may be verified that the higher the battery cycle, the more the difference in current data shown in FIG. 11A increases. In other words, when current data is processed on the basis of the corrected SOC SOC_c, it may be verified that it is able to more clearly distinguish a difference in current data according to battery aging. Comparing FIG. 10B with FIG. 11B, when voltage data is processed on the basis of the corrected SOC SOC_c like the current data, it may be verified that it is able to more clearly distinguish a difference in voltage data according to battery aging. Furthermore, comparing FIG. 10C with FIG. 11C, when temperature data is processed on the basis of the corrected SOC SOC_c like the current data and the voltage data, it may be verified that it is able to more clearly distinguish a difference in temperature data according to battery aging.

Figure 12A:
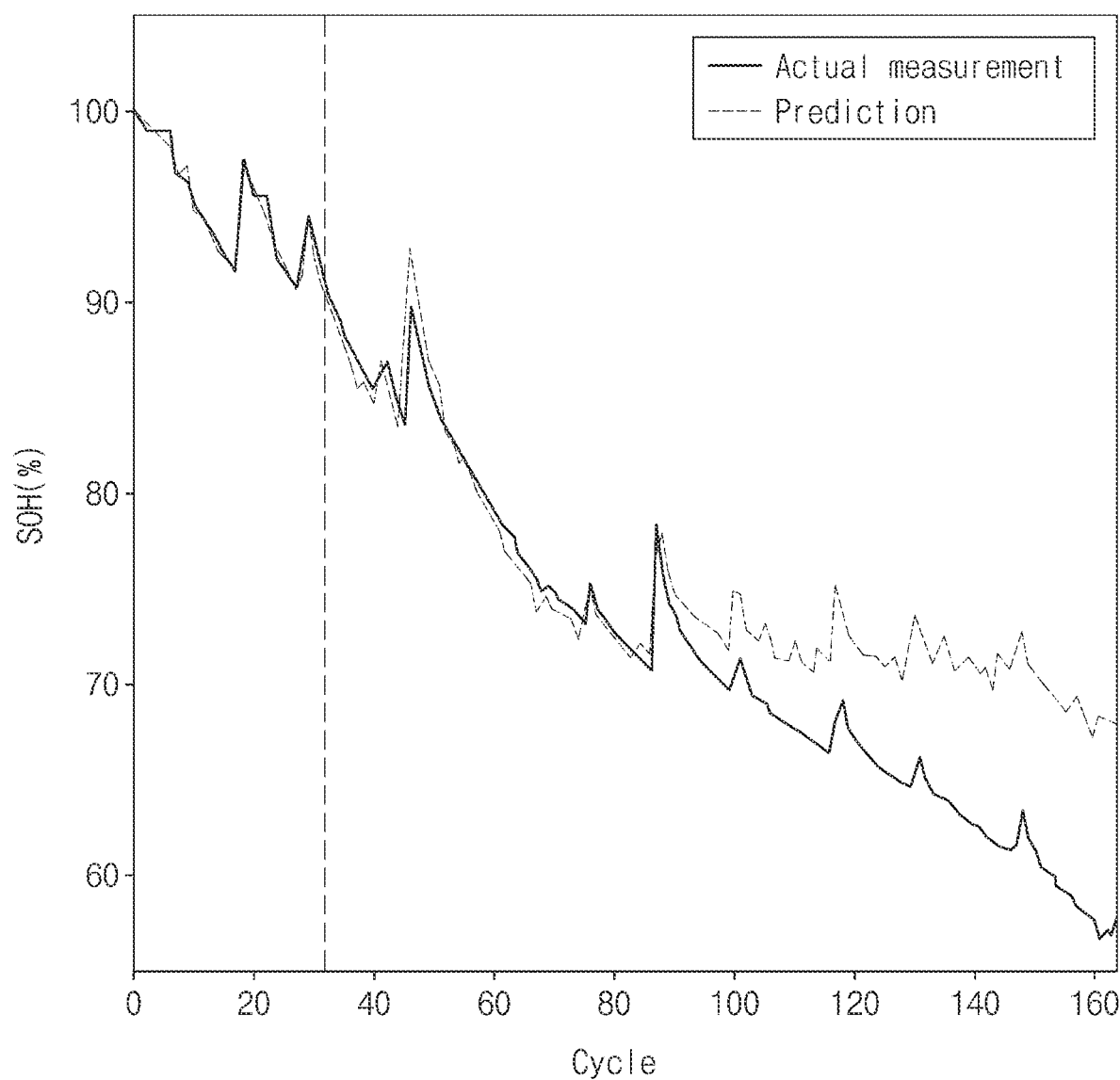
FIG. 12A is a drawing illustrating the result of estimating a state of a battery based on data extracted on the basis of time series.
Figure 12B:
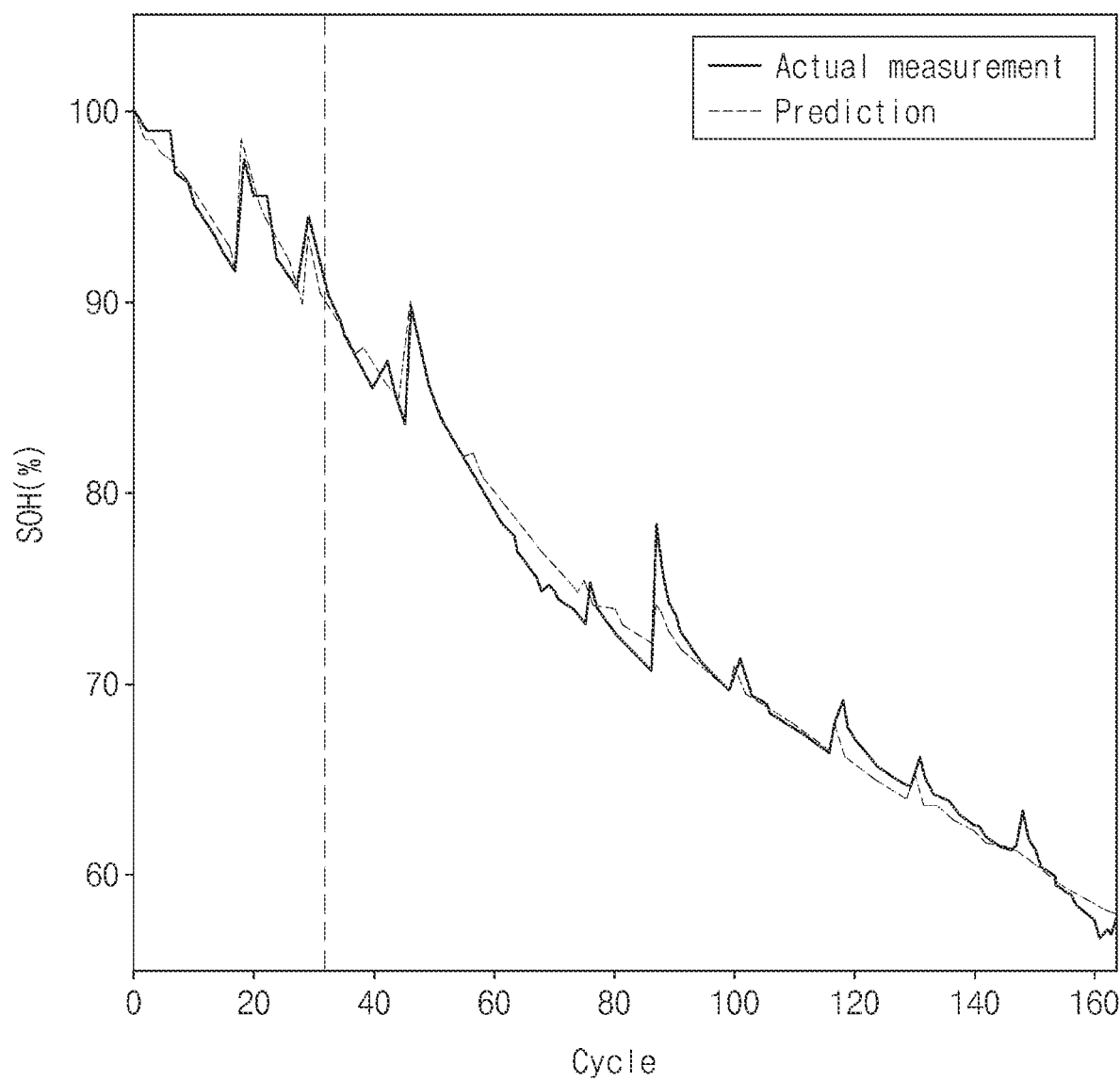
FIG. 12B is a drawing illustrating the result of estimating a state of a battery based on data extracted on the basis of a corrected SOC.

FIG. 12A is a drawing illustrating the result of estimating a state of a battery based on data extracted based on time flow. FIG. 12B is a drawing illustrating the result of estimating a state of a battery based on data extracted on the basis of a corrected SOC SOC_c (refer to FIG. 2). In FIGS. 12A and 12B, the horizontal axis refers to the battery cycle and the vertical axis refers to the state of health (SOH) of the battery. FIGS. 12A and 12B illustrate the result of performing machine learning of a battery state estimating unit 300 (refer to FIG. 1) using data before the battery cycle is 32 and predicting a state of the battery based on subsequent measurement data.

Referring to FIG. 12A, when the state of the battery is estimated on the basis of time series and when the battery cycle is greater than or equal to 80, it may be verified that the result of the prediction significantly deviates from the result of actual measurement. On the other hand, referring to FIG. 12B, when the state of the battery is estimated on the basis of the corrected SOC SOC_c, although the battery cycle increases, it may be verified that a large difference with the result of actual measurement does not occur. In other words, estimating the state of the battery using the corrected SOC SOC_c may derive a more accurate prediction result.

According to the device and method for predicting the state of the battery according to the present disclosure, as the state of the battery is estimated based on a corrected state of charge (SOC) without error accumulation, accuracy of prediction for a state of health (SOH) of the battery may be improved.

According to the device and method for predicting the state of the battery according to the present disclosure, as the state of the battery is estimated based on machine learning, it is not required that the state of the battery is specified to make a previous estimation table.

The above-mentioned contents are detailed embodiments for executing the present disclosure. The present disclosure may also include embodiments capable of being simply changed in design or being easily changed, as well as the above-mentioned embodiments. Furthermore, the present disclosure may also include technologies capable of being easily modified and executed using embodiments. Therefore, the spirit and scope of the present disclosure is defined not by the above-described embodiments, but by those that are identical or equivalent to the claims of the present disclosure as well as the appended claims, which will be described below.

What is claimed is:

1. A device for predicting a state of a battery, the device comprising:
  a data measuring unit configured to measure information about the battery and output first data;
  a data producing unit configured to reflect a change in available capacity of the battery based on at least a portion of the first data to calculate a corrected state of charge and process the first data based on the corrected state of charge to generate second data, and output the second data; and
  a battery state estimating unit configured to estimate state information of the battery based on the second data,
  wherein the data producing unit includes:
  a data arithmetic unit configured to generate the corrected state of charge and battery cycle data based on current data and output the corrected state of charge and the battery cycle data; and
  a data generator configured to process the first data based on the corrected state of charge and the battery cycle data to generate the second data.

2. The device of claim 1, wherein the data arithmetic unit calculates the corrected state of charge using the current data and a rated capacity of the battery, when the battery is in a first state, and calculates the corrected state of charge using the current data and the previously estimated state information, when the battery is in a second state.

3. The device of claim 1, wherein the battery state estimating unit performs machine learning.

4. The device of claim 3, wherein the machine learning is based on at least one of decision tree learning, a support vector machine, a genetic algorithm, an artificial neural network, a convolutional neural network, a recurrent neural network, and reinforcement learning.

5. The device of claim 1, wherein the state information includes at least one of an available capacity of the battery, a current remaining capacity of the battery, and a remaining useful life of the battery.

6. A device for predicting a state of a battery, the device comprising:
   a data measuring unit configured to measure information about the battery and output first data;
   a data producing unit configured to reflect a change in available capacity of the battery based on at least a portion of the first data to calculate a corrected state of charge and process the first data based on the corrected state of charge to generate second data, and output the second data; and
   a battery state estimating unit configured to estimate state information of the battery based on the second data,
   wherein the data producing unit includes a plurality of buffers, classifies the first data depending on a classification criterion based on the corrected state of charge, and stores the first data in the plurality of buffers depending on the classification criterion.

7. The device of claim 6, wherein the data producing unit outputs the second data to the battery state estimating unit, when the first data is stored in each of the plurality of buffers.

8. A method for predicting a state of a battery, the method comprising:
   measuring current data, voltage data, and temperature data for the battery;
   calculating a corrected state of charge based on the current data;
   generating battery cycle data based on the corrected state of charge;
   classifying the current data, the voltage data, and the temperature data for each interval of a value of the corrected state of charge;
   processing the current data, the voltage data, and the temperature data classified for each interval of the value of the corrected state of charge;
   storing the data processed for each interval of the value of the corrected state of charge in a buffer; and
   estimating the state of the battery based on the stored data.

9. The method of claim 8, further comprising:
   performing machine learning for the state of the battery.

10. The method of claim 9, wherein the machine learning is based on at least one of decision tree learning, a support vector machine, a genetic algorithm, an artificial neural network, a convolutional neural network, a recurrent neural network, and reinforcement learning.

\* \* \* \* \*